(12) United States Patent
Rudmann et al.

(10) Patent No.: US 9,559,224 B2
(45) Date of Patent: Jan. 31, 2017

(54) SENSOR MODULE AND METHOD OF MANUFACTURING THE SAME

(71) Applicant: Heptagon Micro Optics Pte. Ltd., Singapore (SG)

(72) Inventors: Hartmut Rudmann, Jona (CH); Markus Rossi, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 66 days.

(21) Appl. No.: 14/413,890

(22) PCT Filed: Jul. 9, 2013

(86) PCT No.: PCT/SG2013/000286
§ 371 (c)(1),
(2) Date: Jan. 9, 2015

(87) PCT Pub. No.: WO2014/014414
PCT Pub. Date: Jan. 23, 2014

(65) Prior Publication Data
US 2015/0179827 A1    Jun. 25, 2015

Related U.S. Application Data

(60) Provisional application No. 61/672,663, filed on Jul. 17, 2012.

(51) Int. Cl.
*H01J 3/14* (2006.01)
*H01L 31/0232* (2014.01)
(Continued)

(52) U.S. Cl.
CPC ......... *H01L 31/0232* (2013.01); *G01L 9/0077* (2013.01); *G01S 7/4813* (2013.01);
(Continued)

(58) Field of Classification Search
CPC ....................................................... H04R 31/00
(Continued)

(56) References Cited

U.S. PATENT DOCUMENTS 5,912,872 A    6/1999 Feldman et al.
6,892,002 B2   5/2005 Christoffersen et al.
(Continued)

OTHER PUBLICATIONS

International Search Report issued in PCT/SG2013/000286 on Oct. 23, 2013.

*Primary Examiner* — Thanh Luu
(74) *Attorney, Agent, or Firm* — Fish & Richardson P.C.

(57) ABSTRACT

The opto-electronic module (1) comprises —a first substrate member (P); —a third substrate member (B); —a second substrate member (O) arranged between said first and third substrate members and comprising one or more transparent portions (ta, tb) through which light can pass, said at least one transparent portion comprising at least a first optical structure (5a;5a';5b;5b'); —a first spacer member (S1) comprised in said first substrate member (P) or comprised in said second substrate member (O) or distinct from and located between these, which comprises at least one opening (4a; 4b); —a second spacer member (S2) comprised in said second substrate member (O) or comprised in said third substrate member (B) or distinct from and located between these, which comprises at least one opening (3); —a light detecting element (D) arranged on and electrically connected to said first substrate member (P); —a light emission element (E) arranged on and electrically connected to said first substrate member (P); —and a sensing element (8) comprised in or arranged at said third substrate member (B). Such modules (1) are particularly suitable as sensor modules for sensing a magnitude such as a pressure.

26 Claims, 3 Drawing Sheets

(51) Int. Cl.
  *G01S 17/88* (2006.01)
  *G01S 7/481* (2006.01)
  *H01L 31/0203* (2014.01)
  *H01L 27/146* (2006.01)
  *G01L 9/00* (2006.01)
  *H01L 27/144* (2006.01)

(52) U.S. Cl.
  CPC ............ *G01S 17/88* (2013.01); *H01L 27/144* (2013.01); *H01L 27/14618* (2013.01); *H01L 27/14625* (2013.01); *H01L 31/0203* (2013.01); *H01L 31/02325* (2013.01); *H01L 2924/0002* (2013.01)

(58) Field of Classification Search
  USPC ........................................................ 381/172
  See application file for complete search history.

(56) References Cited

U.S. PATENT DOCUMENTS

| | | | |
|---|---|---|---|
| 8,045,159 B2 | 10/2011 | Egloff et al. | |
| 2002/0141062 A1 | 10/2002 | Christoffersen et al. | |
| 2003/0209656 A1* | 11/2003 | Paritsky | H04R 23/008 |
| | | | 250/231.1 |
| 2004/0075364 A1* | 4/2004 | Mehta | H01G 5/18 |
| | | | 310/324 |
| 2006/0227845 A1* | 10/2006 | Degertekin | G01D 5/38 |
| | | | 372/102 |
| 2009/0262346 A1 | 10/2009 | Egloff et al. | |

\* cited by examiner

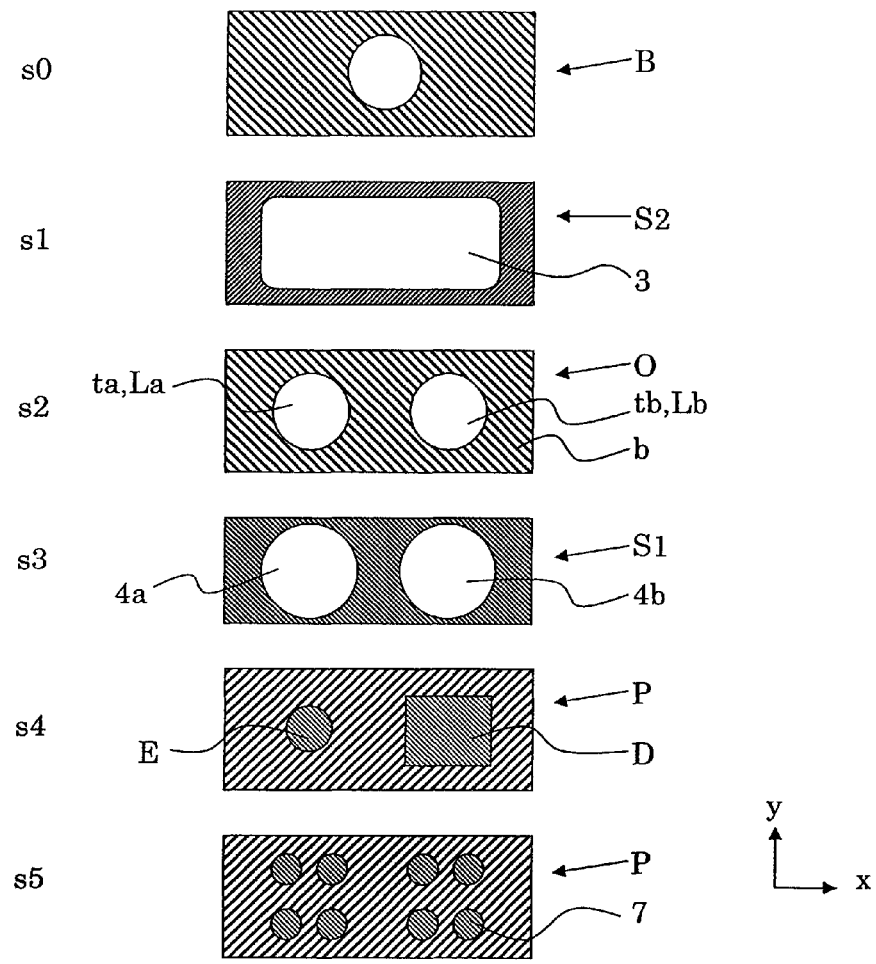
Fig. 2
Fig. 6                    Fig. 7

SENSOR MODULE AND METHOD OF MANUFACTURING THE SAME

TECHNICAL FIELD

The invention relates to the field of sensors and sensing. More specifically, it relates to the packaging and manufacturing of miniaturized sensor modules. More particularly, it relates to opto-electronic modules and to methods of manufacturing the same and to appliances and devices comprising such modules. The invention relates to methods and apparatuses according to the opening clauses of the claims.

DEFINITION OF TERMS

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention, but semiconductor materials, too.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

BACKGROUND OF THE INVENTION

Sensors are widely used in physics, chemistry and in various fields of engineering. Various magnitudes can be sensed using sensors, e.g., pressure and temperature.

For various applications, it can be desirable to provide particularly small sensors. Furthermore, there is generally a demand for particularly precise and for particularly sensitive sensors.

SUMMARY OF THE INVENTION

One object of the invention is to create particularly miniscule or compact or miniaturized opto-electronic module or sensor modules and/or to provide methods for manufacturing the same. Furthermore, corresponding appliances and devices shall be provided.

Another object of the invention is to provide a sensor module which is mass-producible, in particular on wafer scale.

Another object of the invention is to provide a particularly fast way of manufacturing sensor modules.

Another object of the invention is to provide a way of manufacturing sensor modules in a particularly small number of manufacturing steps.

Another object of the invention is to provide a sensor module having a particularly high precision.

Another object of the invention is to provide a sensor module having a particularly high sensitivity.

Another object of the invention is to provide a sensor module for sensing a magnitude while producing little effect only on the sensed magnitude.

Another object of the invention is to provide a sensor module having a particularly high degree of integration.

Further objects emerge from the description and embodiments below.

At least one of these objects is at least partially achieved by apparatuses and methods according to the patent claims.

The opto-electronic module comprises
 a first substrate member;
 a third substrate member;
 a second substrate member arranged between said first and third substrate members and comprising one or more transparent portions through which light can pass, said at least one transparent portion comprising at least a first optical structure;
 a first spacer member comprised in said first substrate member or comprised in said second substrate member or distinct from and located between these, which comprises at least one opening;
 a second spacer member comprised in said second substrate member or comprised in said third substrate member or distinct from and located between these, which comprises at least one opening;
 a light detecting element arranged on and electrically connected to said first substrate member;
 a light emission element arranged on and electrically connected to said first substrate member;
 a sensing element comprised in or arranged at said substrate member.

Such opto-electronic modules can be efficiently manufacturable in high numbers and may provide a high precision. Sensor modules can be realized this way, in particular sensor modules in which a contact-free read-out of changes occurring to said sensing element is accomplished.

Usually, said light emission element is provided for emitting light, in particular for emitting light generally detectable by said light detecting element. And said light detecting element is usually provided for detecting light, more particularly for detecting light emittable by said light emission element.

In a typical module, said second substrate member is distinct from said first and third substrate members.

Said first and/or possible further optical structures are usually provided for redirecting light, for guiding light, or for beam forming.

If said first spacer member is comprised in said first substrate member, it is usually located at an end of said first substrate member facing said second substrate member.

If said first spacer member is comprised in said second substrate member, it is usually located at an end of said second substrate member facing said first substrate member.

If said second spacer member is comprised in said second substrate member, it is usually located at an end of said second substrate member facing said third substrate member.

If said second spacer member is comprised in said third substrate member, it is usually located at an end of said third substrate member facing said second substrate member.

Any of said first or possible further optical structures can be, e.g., a lens or lens element of spherical or aspherical or other type, or a prism or any diffractive and/or refractive optical structure.

In one embodiment, the module comprises a lens comprising said first optical structure, in particular wherein said lens comprises, in addition, a second optical structure. Said second optical structure can be, e.g., a diffractive and/or refractive optical structure, such a lens element.

In one embodiment which may be combined with the before-addressed embodiment
said light emission element,
said one or more transparent portions,
said sensing element, and
said light detecting element
are mutually arranged such that light emitted by said light emission element can propagate along a light path interconnecting
said light emission element,
said one or more transparent portions,
said sensing element, and
said light detecting element.

In one embodiment which may be combined with one or more of the before-addressed embodiments, said module is a sensor module for sensing a magnitude.

Said magnitude can be, e.g., at least one of a mechanical magnitude;
a pressure;
a temperature;
an electromagnetic magnitude;
a magnetic field strength;
an electric field strength
a reflectivity;
an optical absorption or attenuation;
a transmittivity.

In one embodiment of the sensor module, said sensing element is sensitive to changes in said magnitude. It can be provided that said sensing element is structured and configured such that when it is exposed to changes in said magnitude, a change concerning said sensing element is caused. E.g., the amount or strength of said change concerning the sensing element can depend on said change in said magnitude.

E.g., said sensing element can be structured and configured such that it is deformable by changes in said magnitude. And, said sensing element can be structured and configured such that it is movable by changes in said magnitude, wherein movable may comprise one or more of rotatable, tiltable, deplaceable.

It is possible to provide that said sensing element is structured and configured such that it changes its shape or position or orientation in dependence of said magnitude or in dependence of changes in said magnitude.

In one embodiment of the sensor module which may be combined with the before-addressed sensor module embodiment, said sensing element comprises at least one of
a micromechanical element;
an axis of rotation and a portion rotatable around said axis of rotation;
a tilt axis and a portion tiltable about said tilt axis;
a deformable membrane;
a reflective or mirrored membrane;
an optical waveguide.

In case of an optical waveguide, that waveguide can in particular comprise two diffraction gratings, for coupling light into and for coupling light out of the waveguide. And the waveguide may comprise a face, where at the inside of the waveguide, light propagating inside the waveguide may be totally internally reflected (in particular in order to propagate inside the waveguide from an input grating to an output grating), and where at the outside of the waveguide, an object or substance to be sensed may be present, e.g., be absorbed. This way, it is possible to achieve that, depending on properties of said object or substance (such as optical absorption properties, the position of the object or substance and an amount of the object or substance present at said face), a property of the waveguide changes (such as its reflectivity at said face) and, accordingly, a property of light having passed through the waveguide changes. E.g., in reaction to an absorption of molecules of a certain species, a ratio of an intensity of light exiting the waveguide and of an intensity of light fed into the waveguide can decrease.

In one embodiment of the sensor module which may be combined with one or more of the before-addressed sensor module embodiments, a change in said magnitude is detectable in said module via a change in light impinging on said light detecting element. More particularly, it can be provided that said change in said magnitude is detectable in said module via a change in the location on said light detecting element at which light impinges on said light detecting element.

In one embodiment which may be combined with one or more of the before-addressed embodiments, said sensing element comprises an at least partially reflective portion. Said at least partially reflective portion substantially may, e.g., be an at least partially reflective coating or a bulk optical element such as an optical mirror. Usually, said at least partially reflective portion faces said second substrate wafer.

In one embodiment which may be combined with one or more of the before-addressed embodiments, said light detecting element is at least one of
a one-dimensional light detector;
a two-dimensional light detector;
a position-sensitive light detector.

Generally, and this applies to all described embodiments, the detection element can be any light detector or light detector arrangement. A detection element can detect or sense light; thus, it can also be referred to as a light sensing element or as a light sensor. It can be a two-dimensional light detector such as a multi-pixel image sensor, e.g., in CMOS technology or a CCD device, or a one-dimensional light detector such as a linear arrangement of photo diodes, or a zero-dimensional light detector such as a single photo diode. The first type of detection elements are considered to have spatial resolution (or position-sensitivity) in two lateral directions, the latter in one lateral direction only, and the last to provide no spatial resolution (and no position-sensitivity). For various applications, one- or two-dimensional light detectors will be used rather than zero-dimensional ones. Position sensitivity means, more specifically, that a corresponding detection element is capable of distinguishing between different locations of light incidence (on itself).

Said light detecting element may be, e.g., at least one of
a multi-pixel light detector;
a multi-pixel light detector of linear type;
a multi-pixel light detector of two-dimensional type;
an image detector, in particular of CMOS-type or of CCD type;
an arrangement of light detectors along a line, in particular along a straight line;
a linear arrangement of photo diodes;
a two-dimensional arrangement of photo diodes.

In one embodiment which may be combined with one or more of the before-addressed embodiments, said second substrate wafer comprises at least one non-transparent blocking portion. It can, more specifically, be provided that each of said transparent portions is laterally enclosed by said at least one blocking portion This blocking portion usually is provided for blocking a propagation of light across the blocking portion, at least in case of light generally detectable by the light detection element.

Accordingly, it can be provided that said optics wafer comprises at least one portion, referred to as blocking portion, which is at least substantially non-transparent for at least a specific wavelength range, and at least one other portion, namely a transparent portion, which is at least substantially transparent for at least said specific wavelength range.

In one embodiment which may be combined with one or more of the before-addressed embodiments, said first spacer member comprises at least a first and a second opening. These openings are usually separate from each other, in particular separated by a portion of the first spacer wafer. This is particularly useful in case of modules with two or more channels. E.g., said light emission element can be located within or at said first opening and said light detecting element within or at said second opening. And, if present, it can also be provided that said first transparent portion is located at said first opening and said second transparent portion at said second opening.

In one embodiment which may be combined with one or more of the before-addressed embodiments, said at least one opening in said first spacer member is delimited and, in particular fully enclosed, by said first and second substrate members and said first spacer member.

In one embodiment which may be combined with one or more of the before-addressed embodiments, said at least one opening in said second spacer member is delimited and, in particular fully enclosed, by said third and second substrate members and said second spacer member.

One or both of the last-addressed embodiments can be useful for realizing optically and/or hermetically sealed modules or module portions. At least one or two or three or even more cavities can be formed in the module. In said cavities, one or more passive optical components and/or one or more active optical components may be present. In particular, the openings or cavities encased in the module may be hermetically sealed. This may protect their respective insides from detrimental influences such as dust or dirt. Hence, optical components in the module can be protected this way, and light paths inside the module remain in good condition for a long time.

In one embodiment which may be combined with one or more of the before-addressed embodiments,
said first substrate member has a first face which is substantially planar;
said third substrate member has a fourth face facing said first face, which is substantially planar and is aligned substantially parallel to said first face,
said second substrate member has a second face facing said first face, which is substantially planar and is aligned substantially parallel to said first face and a third face facing said fourth face, which is substantially planar and is aligned substantially parallel to said first face.

Typically, said light detecting element and said light emission element are present on said first face. And also typically, said one or more optical structures are present on said second face and/or on said third face.

Note that directions perpendicular to said first face are referred to as vertical directions.

In one embodiment which may be combined with one or more of the before-addressed embodiments, by said first substrate member, at least one electrical connection across the first substrate member is provided. More particularly, it can be provided that said first substrate member substantially is a printed circuit board or a printed circuit board assembly.

In one embodiment which may be combined with one or more of the before-addressed embodiments, said first, second and third substrate members and said first and second spacer members are of generally block- or plate-like shape, possibly comprising at least one hole. A wafer-level manufacture of such modules may be well possible.

In one embodiment which may be combined with one or more of the before-addressed embodiments, outer bounds of a vertical silhouette of the module (i.e. the outer borders of a shape described by the module in a projection into a lateral plane) and outer bounds of a vertical silhouette of said first, second and third substrate members and of said first and second spacer members (i.e. the outer borders of a shape described by the respective member in a projection into a lateral plane) each describe a substantially rectangular shape. This can effect an enhanced manufacturability. In particular, all of the mentioned vertical silhouettes can describe one and the same rectangular shape. It can be provided that lateral dimensions of all said members are substantially identical. It is well possible to wafer-level manufacture such modules, which in turn can result in high-precision high-volume manufacturing.

In one embodiment which may be combined with one or more of the before-addressed embodiments, at least one of said first, second and third substrate members and first and second spacer members, in particular all of these, are, at least in part, made substantially of at least substantially non-transparent material. Of course, said one or more transparent portions are not made of an at least substantially non-transparent material. Such a choice of material can inhibit undesired exit of light out of the module and/or avoid that undesired light enters the module. It may contribute to optically sealing the module, wherein the optical sealing may (locally) interrupted in the region of the sensing element, in particular solely thereby. Accordingly, it may be provided that the first and the second substrate members are substantially in full, except for said one or more transparent portions, made substantially of an at least substantially non-transparent material. And also the third substrate members may be substantially in full, possibly except for a region where said sensing element is present, made substantially of an at least substantially non-transparent material. It may furthermore be provided that said first and second spacer members are substantially in full made substantially of an at least substantially non-transparent material. Suitable non-transparent materials may be, e.g., polymer materials. Said first substrate member can be substantially (or at least predominantly) made of a semiconductor material, more specifically of silicon, and, alternatively, it may be substantially (or at least predominantly) made of a printed circuit base material such as polyimide or an FR4 material.

In one embodiment which may be combined with one or more of the before-addressed embodiments, at least one of said first and second spacer members, in particular both, said first and said second spacer member, is at least one of made of a hardened hardenable material and obtained using a replication process. This can make possible to achieve an enhanced manufacturability. And this can make possible to provide spacer members in form of unitary parts in an efficient way and in high precision. Hardening may be accomplished, e.g., by heating, in particular if the respective spacer member is substantially made of non-transparent material.

In one embodiment which may be combined with one or more of the before-addressed embodiments, said second substrate member is, at least in part, at least one of made of a hardened hardenable material and obtained using a replication process. In particular, at least said first optical structure can be, at least in part, at least one of made of a hardened hardenable material and obtained using a replication process.

In one embodiment which may be combined with one or more of the before-addressed embodiments, at least one of said first and second spacer members, in particular both, said first and said second spacer member, is a unitary part. This may in particular be provided when one or both of said spacer members is distinct from all said substrate members.

Typically, one or both of said spacer members, in particular when distinct from said substrate members, has a vertical extension which is limited to the vertical range from the above-mentioned first face to the above-mentioned second face.

Generally, a spacer member, more particularly a separate (distinct) spacer member, can also be referred to as a distancing member, because it can effect a well-defined (vertical) distance between adjacent substrate members, more particularly between the respective faces.

In one embodiment which may be combined with one or more of the before-addressed embodiments, the module comprises a housing, said housing being, possibly except for a portion of said third substrate member comprising said sensing element, completely non-transparent, such that light can enter or exit an inside volume of the module, if at all, solely through said portion of said third substrate member, in particular wherein said first, second and third substrate members and said first and second spacer members contribute to, and more particularly, make up for said housing. Said inside volume can in particular be hermetically sealed.

In one embodiment which may be combined with one or more of the before-addressed embodiments, a maximum vertical extension of the module is at most 40 mm, in particular at most 25 mm.

In one embodiment which may be combined with one or more of the before-addressed embodiments, a maximum lateral extension of the module is at most 35 mm, in particular at most 20 mm.

The appliance comprises a multitude of opto-electronic modules of the above-described kind. The appliance can in particular be a wafer stack. Such an appliance or wafer stack is particularly useful for mass-producing above-described modules.

In one embodiment, the appliance comprises
  a first substrate wafer comprising a multitude of said first substrate members;
  a second substrate wafer comprising a multitude of said second substrate members;
  a third substrate wafer comprising a multitude of said third substrate members;
  a first spacer wafer comprising a multitude of said first spacer members, wherein said first spacer wafer is comprised in said first substrate wafer or is comprised in said second substrate wafer or is distinct from these;
  a second spacer wafer comprising a multitude of said second spacer members, wherein said second spacer wafer is comprised in said third substrate wafer or is comprised in said second substrate wafer or is distinct from these;
  a multitude of said light detecting elements arranged on said first substrate wafer;
  a multitude of said light emission elements arranged on said first substrate wafer; and
  a multitude of said sensing elements comprised in or arranged at said third substrate wafer.

In such an appliance, usually,
  one of said light detecting elements;
  one of said light emission elements;
  one or more of said transparent portions and optical portions;
  one of said sensing elements;
are allocated with each other. After a separation step, these will belong to one and the same sensor module.

It is possible to provide that said first substrate wafer substantially is a printed circuit board or a printed circuit board assembly.

The method for manufacturing an opto-electronic module comprises the steps of
a) providing a first substrate wafer on which a multitude of light emission elements and a multitude of light detecting elements are present;
b) providing a second substrate wafer comprising a multitude of transparent portions through which light can pass, at least a plurality of said multitude of transparent portions comprising at least a first optical structure each;
c) providing a third substrate wafer, wherein a multitude of sensing elements is comprised in or arranged at said third substrate wafer;
d) providing a first spacer wafer comprised in said first substrate wafer or comprised in said second substrate wafer or distinct from these, which comprises a multitude of openings;
e) providing a second spacer wafer comprised in said third substrate wafer or comprised in said second substrate wafer or distinct from these, which comprises a multitude of openings;
f) forming a wafer stack comprising said first substrate wafer, said second substrate wafer, said third substrate wafer, said first spacer wafer and said second spacer wafer such that said second substrate wafer is arranged between said first and said third substrate wafers and that said first spacer wafer is arranged between said first and said second substrate wafers and that said second spacer wafer is arranged between said third and said second substrate wafers.

This way, efficient mass-production of opto-electronic modules or sensor modules of high precision may be achieved.

In one method embodiment, in said wafer stack, each of said light emission elements is allocated with an opening of said openings of said first spacer wafer and with a transparent portion of said transparent portions, and each of said light detecting elements is allocated with an opening of said openings of said first spacer wafer and with a transparent portion of said transparent portions.

It is also possible to provide that, in said wafer stack, each of said light emission elements is located within an opening of said openings of said first spacer wafer, and each of said light detecting elements is located within an opening of said openings of said first spacer wafer.

In one embodiment which may be combined with one or more of the method embodiments, the method comprises the step of l) positioning each of said multitude of light emission elements and/or each of said multitude of light detecting elements on said first substrate member using a pick-and-place step.

In one embodiment which may be combined with one or more of the before-addressed method embodiments, the method comprises at least one of the steps of m1) manufacturing said first spacer wafer using replication, in particular an embossing process;

m2) manufacturing said second spacer wafer using a replication process, in particular an embossing process.

In one embodiment which may be combined with one or more of the before-addressed method embodiments, the method comprises at least one of the steps of n) manufacturing said optical structures using a replication process, in particular an embossing process.

In one embodiment referring to the last-addressed embodiment, step n) comprises the steps of n1) depositing replication material, in particular on a precursor wafer to become said second substrate wafer;

n2) bringing a replication tool into contact with said replication material;

n3) hardening said replication material;

n4) removing said replication tool.

In step n3), heat or UV radiation may be applied.

In one embodiment which may be combined with one or more of the before-addressed method embodiments, each of said sensing elements comprises an at least partially reflective portion, said at least partially reflective portion usually facing said second substrate wafer.

In one embodiment which may be combined with one or more of the before-addressed method embodiments, the method comprises at least one of the steps of g) separating said wafer stack into said multitude of opto-electronic modules.

Said separating may be accomplished using known dicing techniques, e.g., sawing, laser cutting and others. It can be provided that each of said opto-electronic modules is an opto-electronic module of the above-described kind.

The invention comprises modules with features of corresponding methods according to the invention, and, vice versa, also methods with features of corresponding modules according to the invention.

The advantages of the modules basically correspond to the advantages of corresponding methods, and, vice versa, the advantages of the methods basically correspond to the advantages of corresponding modules.

Furthermore, a method for manufacturing a device is provided. The method for manufacturing the device, said device comprising an opto-electronic module, comprises manufacturing said opto-electronic module according to one of the above-described methods, in particular wherein said opto-electronic module is an opto-electronic module of the above-described kind.

In particular, the device can be a sensor or a communication device such as a smart phone, it can be a hand-held device and/or a mobile computing device.

The device according to the invention comprises a module of the above-described kind, in particular wherein said device comprises a printed circuit board to which said module is operationally connected. Possible kinds of devices have been mentioned above. However, the device can in particular be an electronic device; it can in particular be a sensor; the device can also be a mobile and/or hand-held device; it can be a communication device such as a smart phone.

In a particular aspect of the invention, the invention comprises a particular sensor module for sensing a magnitude: That sensor module comprises a sensing element and an optical read-out arrangement for detecting changes of said sensing element, wherein said optical read-out arrangement comprises a first substrate member;

a light detecting element and a light emission element, both arranged on and electrically connected to said first substrate member;

a second substrate member arranged between said first substrate member and said sensing element, comprising one or more transparent portions through which light can pass, said at least one transparent portion comprising at least a first optical structure; and a first spacer member comprised in said first substrate member or comprised in said second substrate member or distinct from and located between these, which comprises at least one opening.

As is readily understood, various of the features of the opto-electronic modules described further above can be present also in such a sensor module and more particularly in the optical read-out arrangement. These are, with some exceptions, not repeated here.

In one embodiment of the sensor module, said light detecting element is at least one of a one-dimensional light detector;

a two-dimensional light detector;

a position-sensitive light detector.

In one embodiment which may be combined with the before-addressed sensor module embodiment, said sensing element is sensitive to changes in said magnitude. The sensing element may, e.g., be subject to changes in its position and/or its shape in reaction to changes in said magnitude.

Further embodiments and advantages emerge from the dependent claims and the figures.

BRIEF DESCRIPTION OF THE DRAWINGS

Below, the invention is described in more detail by means of examples and the included drawings. The figures show in a strongly schematized manner:

FIG. 2 various cross-sectional views of constituents of the module of FIG. 1;

FIG. 6 a sensor substrate member in a cross-sectional view;

FIG. 7 a sensor substrate member in a cross-sectional view.

The described embodiments are meant as examples and shall not confine the invention.

DETAILED DESCRIPTION OF THE INVENTION

Figure 1:
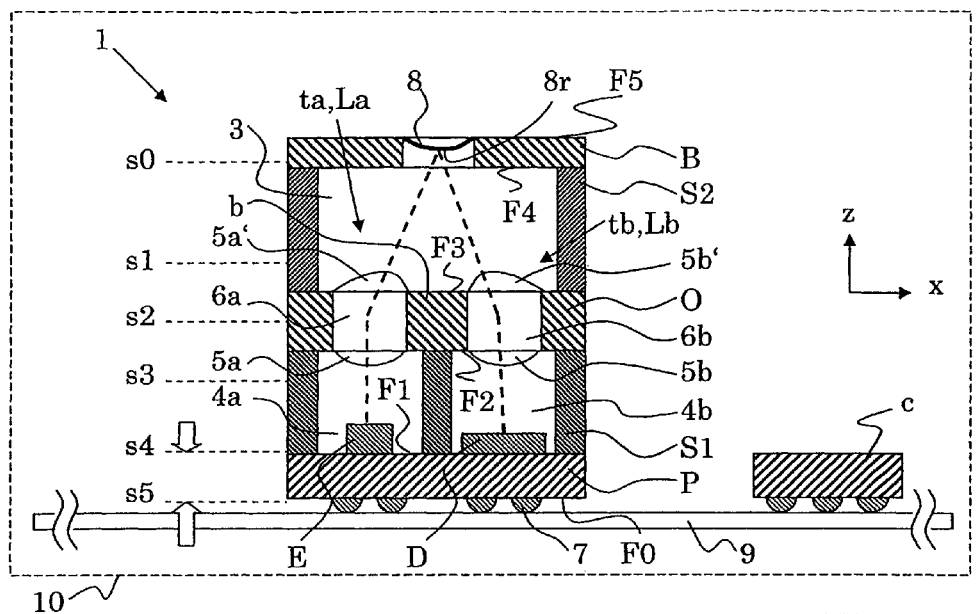
FIG. 1 a cross-sectional view of an opto-electronic module embodying a sensor module having a membrane.

FIG. 1 illustrates a cross-sectional view of an opto-electronic module 1 embodying a sensor module having a sensing element 8 which is embodied as a membrane. At the same time, FIG. 1 illustrates a device 10 comprising such a module 1.

The illustrated cross-section is a vertical cross-section. FIG. 2 shows various lateral schematic cross-sectional views of constituents of the module of FIG. 1, wherein the approximate positions of these lateral cross-sections are indicated in FIG. 1 by s0 to s5 and dashed lines. For s4 and s5, the direction of view is indicated by arrows.

Device 10 can be, e.g., an electronic device and/or a sensor device. It may be, e.g., a hand-held communication device such as a smart phone. Module 1 is particularly suitable for such applications because it can be manufactured having a particularly small size and it is mass-producible using wafer-level manufacturing techniques. Device 10 comprises, besides module 1, a printed circuit board 9 on which module 1 is mounted. In addition mounted on printed circuit board 9 is an integrated circuit c such as a control unit or controller chip which is operationally interconnected with module 1 by printed circuit board 9. E.g., integrated circuit c may evaluate signals outputted by module 1 and/or provide signals to module 1 for controlling the same.

Module 1 comprises several constituents (P, S1, O, S2, B) stacked upon each other in a direction through which the term "vertical" is defined; it corresponds to the z direction (cf. FIG. 1). Directions in the x-y plane (cf. FIG. 2) perpendicular to the vertical (z) direction are referred to as "lateral".

Module 1 comprises a first substrate member P, a first spacer member S1, a second substrate member O, also referred to as optics member O, a second spacer member S2 and a third substrate member B, also referred to as sensor substrate member B, all stacked upon each other. The members comprise faces F0, F1, F2, F3, F4 and F5 as indicated in FIG. 1. Substrate member P is, e.g., a printed circuit board assembly. The printed circuit board (PCB) of this PCB assembly can more specifically also be referred to as an interposer. On the PCB, a light emission element E for emitting light, e.g., infrared light or visible light, is mounted. This can be, e.g., a light-emitting diode or a laser diode, in particular a VCSEL (vertical-cavity surface-emitting laser). Furthermore, a light detecting element D is mounted on substrate member P, for detecting light, in particular light emittable by light emission element E. This can in particular be, e.g., an image detector or a one-dimensional detector such as a linear array of photo diodes.

Electrical contacts of light emission element E and light detecting element D are electrically connected (across substrate member P) to the outside of module 1, where solder balls 7 are attached. Instead of providing solder balls 7, it would also be possible to provide contact pads on the PCB which are not (or at a later time) provided with solder balls.

This way, module 1 can be mounted on a printed circuit board 9, e.g., in surface mount technology (SMT), next to other electronic components, such as integrated circuit c.

Spacer member S1 has two openings 4a,4b, light emission element E arranged in one of them (4a) and light detecting element D being arranged in the other (4b). This way, light emission element E and light detecting element D are laterally encircled by separating member S1, and two separate channels are formed in module 1, in particular two optically separate channels in the space between substrate members P and O.

Spacer member S1 may fulfill several tasks. It can ensure a well-defined distance between substrate member P and optics member O (through its vertical extension) which can help to achieve well-defined light paths from emitting member E through optics member O (through transparent portion ta) and from opening 3 through optics member O (via transparent portion tb) onto light detecting element D. Therefore, spacer member S1 can also be referred to as a separation member (separation member S1). Spacer member S1 can also provide protection of light detecting element D from light that is not supposed to be detected by detection element D, by being substantially non-transparent to light generally detectable by light detecting element D and by forming a portion of the outside walls of module 1. And, spacer member S1 can also provide protection of light detecting element D from light emitted by emitting member E which should not reach light detecting element D, so as to reduce optical cross-talk between light emission element E and detecting member D, by being substantially non-transparent to light (in particular to light generally detectable by light detecting element D) and by forming a wall (or: channel separator) between light emission element E and light detecting element D. Light reflected inside module 1 and stray light originating from light emission element E can be kept from reaching light detecting element D this way. Typically, separating member S1 is made of a polymer material, in particular of a hardenable or more specifically curable polymer material, e.g., of an epoxy resin.

Optics member O comprises a blocking portion b and two transparent portions ta and tb, respectively, one (ta) for allowing light emitted by light emission element E to leave opening 4 a and enter opening 3, and another one (tb) for allowing light to enter opening 4b from opening 3 and reach light detecting element D.

Transparent portions ta, tb each comprise a passive optical component La and Lb, respectively, more particularly and as in the illustrated example, a lens member each, for light guidance and/or beam forming. Lens members La, Lb may, e.g., comprise, as shown in FIG. 1, two lens elements 5a, 5a' and 5b, 5b', respectively, in close contact to a transparent element 6a and 6b, respectively. Transparent elements 6a, 6b can have the same vertical dimension as optics member O where it forms blocking portion b, such that optics member O where it forms blocking portion b together with transparent elements 6 describes a (close-to-perfect) solid plate shape. Lens elements 5a, 5a', 5b, 5b', redirect light by refraction (cf. FIG. 1) and/or by diffraction (not illustrated). E.g., they may all be of generally convex shape (as shown in FIG. 1), but one or more of the lens elements may be differently shaped, e.g., generally or partially concave. Lens elements 5a', 5b' may be, e.g., aspherical lens elements, as illustrated in FIG. 1.

Spacer member S2 has one opening 3 which laterally encircles a volume present between substrate members B and O.

Spacer member S2 may fulfill several tasks. It can ensure a well-defined distance between substrate member B and optics member O (through its vertical extension) which can help to achieve well-defined light paths between sensing element 8 and each of the transparent portions ta and tb. Therefore, spacer member S2 can also be referred to as a separation member (separation member S2).

Spacer member S2 can also provide protection against light entering the before-mentioned volume that is not supposed to enter that volume, namely by being substantially non-transparent to light (at least to light generally detectable by light detecting element D) and by forming a portion of the outside walls of module 1. Typically, separating member S2 is made of a polymer material, in particular of a hardenable or more specifically curable polymer material, e.g., of an epoxy resin.

Substrate member B is, at least predominantly, made of a non-transparent material such as a non-transparent polymer material. This is the case at least in the region where sensing element 8 is not present.

The volumina laterally enclosed by spacer members S1,S2 can in particular be hermetically sealed, which not only prevents dust or other particles from degrading optical properties, but also contributes to the possibility of measuring pressures using module 1. For the latter purpose, sensing element 8 basically is a membrane deforming upon experiencing different pressures on its opposite sides, i.e. different pressures between the regions present adjacent to faces F4 and F5, respectively, of member B. The membrane may be made of, e.g., a silicone, bonded to member B.

Inside and by means of module 1, deformations of the membrane can be detected or monitored in a contact-free manner, using light. On that side of the membrane which faces towards optics member O, sensing element 8 has a reflective portion 8r. Reflective portion 8r may be embodied by a coating present on sensing element 8, or by a mirror attached to sensing element 8. Light emitted by light emission element E having passed transparent region ta will be reflected by reflective portion 8r in different ways, depending on the deformation of the membrane and thus depending on a pressure to be sensed. Thus, the light path along which the light travels from reflective portion 8r through transparent portion tb to detection element D and the location on detection element D where the light finally impinges on detection element D depends on the pressure to be sensed. Accordingly, the magnitude to be sensed, i.e., in the illustrated embodiment, the pressure, can be deduced from that location on detection element D. With detection element D having position sensitivity, this is readily accomplished. Typically after some gauging, a corresponding pressure values can be obtained, e.g., by means of integrated circuit c.

Such a module 1 may thus be a pressure sensor module.

The lateral shape of openings 3, 4a and 4b and also of transparent portions ta, tb may, e.g., be circular or have other appearances, e.g., polygonal or rectangular with rounded corners.

Module 1 is an opto-electronic component, more precisely a packaged opto-electronic component. The vertical side walls of module 1 are formed by items P, S1, S2, O and B. A bottom wall is formed by substrate member P, and a top wall by sensor substrate member B.

As is well visible in FIG. 2, the five items P, S1, S2, O, B, which can for the reasons above also be referred to as housing components, all have substantially the same lateral shape and lateral dimensions. This is related to a possible and very efficient way of manufacturing such modules 1 which is described in more detail below referring to FIGS. 3 and 4. These housing components P, S1, S2, O, and B are all of generally block- or plate-like shape or more generally of generally rectangular parallelepiped shape, possibly having holes or openings (such as spacer members S1, S2 do) or projections (such as optics member O does).

It is furthermore possible to provide modules which are designed according to the same principles as discussed above, but comprising one or more additional electronic components such as one or more additional active optical components, e.g., light detectors or light sources; or one or more integrated circuits. Additional passive optical components may be provided as well.

The active electronic components comprised in a module (such as light emission element E and light detecting element D in the example of FIG. 1) can be packaged or unpackaged electronic components. For contacting substrate member P, technologies such as wire-bonding or flip chip technology or any other known surface mount technologies may be used, or even conventional through-hole technology.

Figure 3:
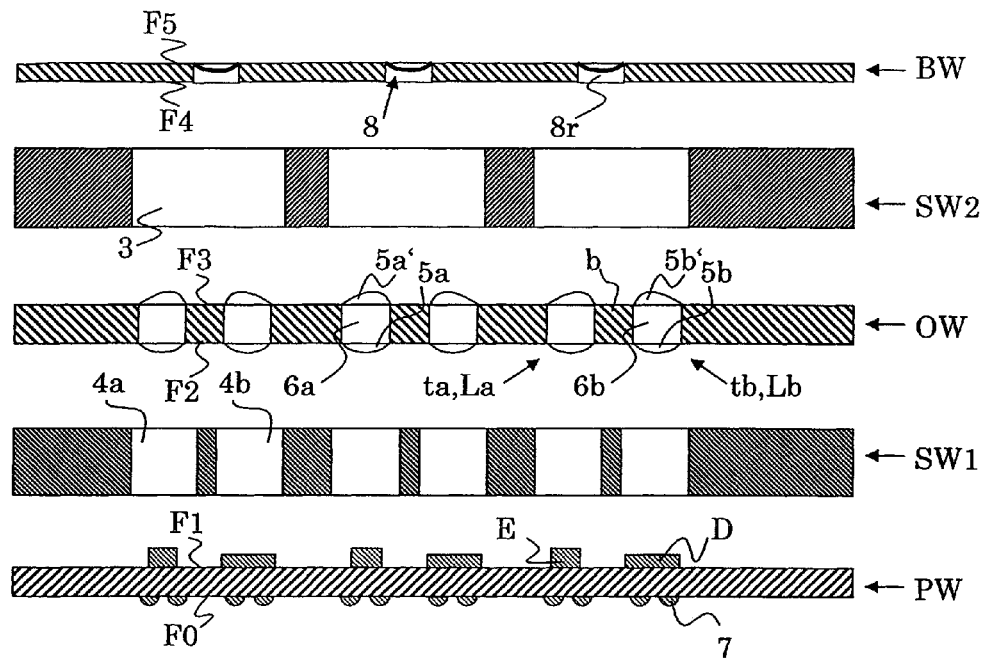
FIG. 3 a cross-sectional view of wafers for forming a wafer stack for manufacturing a multitude of modules of FIG. 1.

FIG. 3 shows a schematical cross-sectional view of wafers for forming a wafer stack for manufacturing a multitude of modules 1 as shown in FIG. 1. It is possible to manufacture such modules 1 (practically) completely on wafer-scale, of course with a subsequent separation step. Although FIGS. 3 and 4 only show provisions for three modules 1, there will usually be in one wafer stack provisions for at least 10, rather at least 30 or even more than 50 modules in each lateral direction. Typical dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

Five wafers are sufficient for manufacturing a multitude of modules as shown in FIG. 1: A substrate wafer PW, two spacer wafers SW1 and SW2, an optics wafer OW and a sensor wafer BW. Each wafer comprises a multitude of the corresponding members comprised in the corresponding module 1 (cf. FIGS. 1 and 2), usually arranged on a rectangular lattice, typically with a little distance from each other for a wafer separation step.

Substrate wafer PW can be a PCB assembly comprising a PCB of standard PCB materials, provided with solder balls 7 on the one side and with active optical components (E and D) soldered to the other side. The latter can be placed on substrate wafer PW by pick-and-place using standard pick-and-place machines.

In order to provide maximum protection from detecting undesired light, all wafers PW, SW1, SW2, OW, BW can substantially be made of a material substantially non-transparent for light detectable by detecting members D, of course except for transparent areas such as transparent portions ta, tb and openings 3, 4a, 4b.

Wafers SW1 and SW2 and possibly also all or a portion of wafers OW and BW can be produced by replication. In an exemplary replication process, a structured surface is embossed into a liquid, viscous or plastically deformable material, then the material is hardened, e.g., by curing using ultraviolet radiation or heating, and then the structured surface is removed. Thus, a replica (which in this case is an negative replica) of the structured surface is obtained. Suitable materials for replication are, e.g., hardenable (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

In case of optics wafer OW, replication or molding may be used for obtaining the non-transparent portions (blocking portions b). It would also be possible to provide holes, where transparent portions ta, tb are supposed to be, by drilling or by etching.

Subsequently, a so-obtained precursor wafer is provided with passive optical components La, Lb, so as to yield optics wafer OW. This may be accomplished by means of replication, e.g., forming lens members La, Lb as a unitary parts, e.g., as described in US 2011/0043923 A1. The lens members La, Lb can, however, also be manufactured starting from a semi-finished part being a wafer comprising transparent elements 6 within holes by which transparent portions ta, tb are defined. This can be particularly useful when the lens members La, Lb each describe at least one apex, and those apices are located outside a vertical cross-section of the optics wafer OW. Such a semi-finished part is (usually, and in the exemplary case shown in the figures) a flat disk-like wafer having no holes penetrating the wafer (in the regions where the transparent portions ta, tb shall later on be) and having virtually no or only shallow surface corrugations, such surface corrugations usually being concave, i.e. not extending beyond the wafer surface as described by the blocking portions b.

A semi-finished part like that can be obtained starting from a flat precursor wafer (typically made of exactly one material) having holes or openings where the transparent portions are supposed to be and then filling the holes with transparent material, e.g., using a dispensing process, and either filling the holes in the precursor wafer one-by-one, e.g., using a dispenser such as used for underfilling processes in flip-chip technology or the like, or by filling several holes at once, e.g., using a squeegee process (e.g. as known from screen printing) or a dispenser with several hollow needles outputting material. During the dispensing, the wafer can be placed on a flat support plate, e.g., made of a silicone. Care has to be taken order to prevent the formation of air bubbles or cavities in the dispensed material, since this would degrade the optical properties of the lens members La, Lb to be produced. E.g., one can carry out the dispensing in such a way that wetting of the wafer material starts at an edge formed by the wafer and an underlying support plate (or in a place close to such an edge), e.g., by suitably guiding a hollow needle outputting the material close to such an edge. Subsequently, the dispensed material is cured, e.g., by heat or UV radiation, so as to obtain hardened transparent material.

Convex meniscuses possibly formed this way can be flattened by polishing, so as to obtain transparent elements 6 having parallel surfaces adjusted to the wafer thickness. Then, by means of replication, lens elements 5a, 5a', 5b, 5b' are applied to typically both sides (top and button side) of wafer OW, e.g., using replication, in particular embossing. In case of concave meniscuses of the transparent elements, the replication can take place on these, wherein the amount of applied replication material might have to be adjusted accordingly.

As has already been mentioned, it is generally possible to provide that said spacer wafers SW1 and/or SW2 are obsolete in the sense that a particular kind of optics wafer, a particular kind of sensor wafer and/or a particular kind of substrate wafer is provided. Namely a wafer ("combined optics wafer" or "combined sensor wafer" or "combined substrate wafer") which incorporates the features and functionalities of the respective spacer wafer and the respective other wafer. Producing such a "combined wafer" may be accomplished using a particular precursor wafer and, manufactured based thereon, a particular semi-finished part. Such a precursor wafer and semi-finished part, respectively, has at least one structured surface, usually having protrusions extending vertically beyond at least one of the two surfaces of transparent elements to be provided in the precursor wafer and present in the semi-finished part, respectively. Looking upon wafers OW and SW1 (or, e.g., wafers OW and SW2, or wafers BW and SW2, or wafers OW and SW1 and SW2) in FIG. 4 as one single part, it can be readily visualized what a corresponding "combined wafer" for manufacturing a module according to FIG. 1 and also a corresponding semi-finished part would look like.

In order to form a wafer stack 2, the wafers are aligned and bonded together, e.g., by gluing, e.g., using a heat-curable epoxy resin. It is usually a critical point to ensure that each active optical component (such as detecting members D and emission elements E on the substrate wafer PW) is sufficiently accurately allocated with a corresponding passive optical component (such as lens members La, Lb of optics wafer OW).

Figure 4:
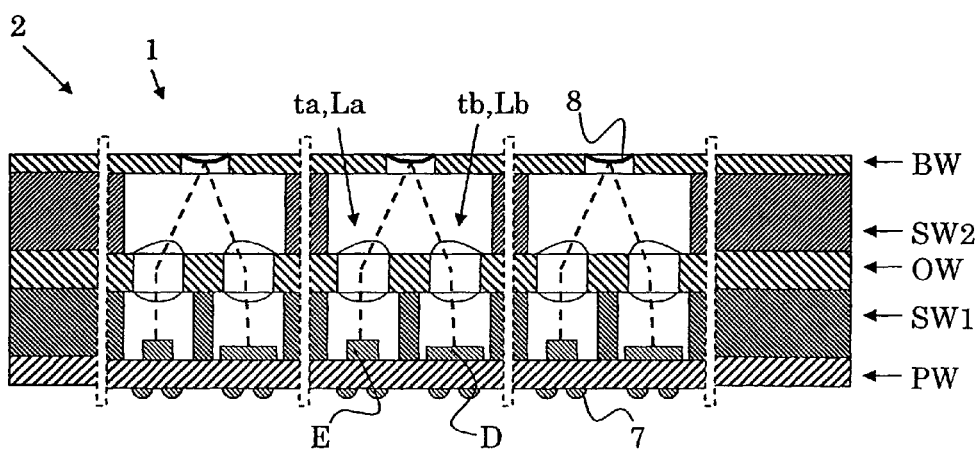
FIG. 4 a cross-sectional view of a wafer stack for manufacturing a multitude of modules of FIG. 1.

FIG. 4 shows a cross-sectional view of a so-obtained wafer stack 2 for manufacturing a multitude of modules 1 as shown in FIG. 1. The thin dashed rectangles indicate where separation takes place, e.g., by means of using a dicing saw.

The fact that most alignment steps are carried out on wafer level makes it possible to achieve a good alignment (in particular of members D and E with respect to members La, Lb and all of these with respect to sensing element 8) in a rather simple and very fast way. The overall manufacturing process is very fast and precise. Due to the wafer-scale manufacturing, only a very small number of production steps is required for manufacturing a multitude of modules 1.

Figure 5:
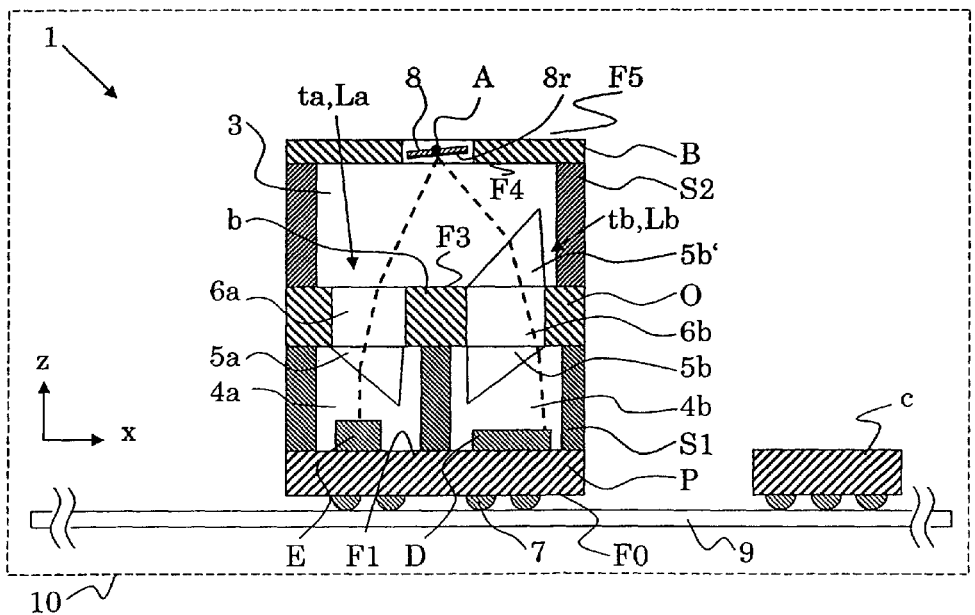
FIG. 5 across-sectional view of an opto-electronic module embodying a sensor module having a rotatable sensing element.

FIG. 5 is a cross-sectional view of an opto-electronic module 1 embodying a sensor module having a rotatable sensing element 8. This module 1 is similar to the one of FIG. 1, but it comprises a different sensing element 8, and differently designed transparent portions ta, tb. In contrast to the embodiment of FIG. 1, the optical structures (items 5a, 5b, 5b') present in the transparent portions ta, tb are not lens elements, but prisms, and, accordingly, unlike in the embodiment of FIG. 1, the passive optical components La, Lb are no lens members.

The sensing element 8 in the embodiment of FIG. 5 is tiltable or rotatable, about an axis A. Sensing element 8 can in particular comprise a plate-shaped part rotatably (or tiltably) mounted to member B, and the plate-shaped part can be a mirror or can be provided with a reflective coating, so as to embody a reflective portion 8r. A magnitude interacting with sensing element 8 so as to cause a tilting of the plate-shaped part about axis A, be it a mechanical or an electrical or magnetic magnitude or force, can thus be sensed by module 1, basically by evaluating where light initially emitted by light emission element E impinges on light detection element D.

FIG. 6 illustrates a sensor substrate member B in a cross-sectional view which can be used as an alternative in the module 1 of FIG. 5. This member B provides mechanical stops for the rotation or tilting of sensing element 8. Also this sensor substrate member B (without sensing element 8) is well manufacturable using replication.

Following the described principles and ideas, various types of sensing modules and sensors can be constructed. Miniscule mass-producible high-precision sensing modules can be created along these lines.

FIG. 7 illustrates a sensor substrate member B in a cross-sectional view which can be used in module 1, e.g., in the one of FIG. 1 or of FIG. 5. This member B provides an optical waveguide as sensing element 8. The optical waveguide has two parallel faces Fa, Fb at which total internal reflection can take place inside the waveguide and comprises an input grating g1 for coupling light into the waveguide (in particular light originating from a light emission element E, cf. FIGS. 1 and 5) and an input grating g2 for coupling light out of the waveguide. If, for example, an object touches face Fb or a substance comes into contact with face Fb or absorbs at face Fb, optical properties of the waveguide can change. E.g., an amount of light exiting the waveguide can reduce, or a spectral composition of light exiting the waveguide can change, or a location where at the waveguide (or where at grating g2) light exits the waveguide can change. Any such change may then be detected, e.g., by means of light detecting element D.

The invention claimed is:

1. A sensor module for sensing a magnitude, the module being an opto-electronic module comprising
   a first substrate member;
   a third substrate member;
   a second substrate member arranged between said first and third substrate members and comprising at least a first and a second transparent portion through which light can pass and at least one blocking portion, wherein each of said transparent portions is surrounded laterally by said at least one blocking portion in a plane perpendicular to a stacking direction of the substrate members, and wherein said transparent portions comprise at least a first optical structure;
   a second spacer member comprised in said second substrate member or comprised in said third substrate member or distinct from and located between these, which comprises at least one opening;
   a light detecting element arranged on and electrically connected to said first substrate member;
   a light emission element arranged on and electrically connected to said first substrate member;
   a sensing element comprised in or arranged at said third substrate member, wherein said sensing element is sensitive to changes in said magnitude; and
   a first spacer member comprised in said first substrate member or comprised in said second substrate member or distinct from and located between these, which comprises at least a first and a second opening which are separated from each other by a portion of the first spacer member,
   wherein the at least one blocking portion is non-transparent to light detectable by the light detecting element, and wherein the first spacer member is, at least in part, non-transparent to light detectable by the light detecting element to reduce optical cross-talk between the light emission element and the light detecting element.

2. The module according to claim 1, wherein
   said first optical structure is a lens or a lens element; or
   the module comprises a lens comprising said first optical structure.

3. The module according to claim 1, wherein
   said light emission element,
   said one or more transparent portions,
   said sensing element, and
   said light detecting element
   are mutually arranged such that light emitted by said light emission element can propagate along a light path interconnecting
   said light emission element,
   said one or more transparent portions,
   said sensing element, and
   said light detecting element.

4. The module according to claim 1, wherein said magnitude is at least one of
   a mechanical magnitude;
   a pressure;
   a temperature;
   an electromagnetic magnitude;
   a magnetic field strength;
   an electric field strength
   a reflectivity;
   an optical absorption or attenuation; or
   a transmittivity.

5. The module according to 1, wherein said sensing element is structured and configured such that it is deformable by changes in said magnitude.

6. The module according to 1, wherein said sensing element is structured and configured such that it is movable by changes in said magnitude.

7. The module according to claim 1, wherein said sensing element comprises at least one of
   a micromechanical element;
   an axis of rotation and a portion rotatable around said axis of rotation;
   a tilt axis and a portion tiltable about said tilt axis;
   a deformable membrane;
   a reflective or mirrored membrane; or
   an optical waveguide.

8. The module according to claim 1, wherein a change in said magnitude is detectable in said module via a change in light impinging on said light detecting element.

9. The module according to claim 1, wherein said sensing element comprises an at least partially reflective portion.

10. The according to claim 1, wherein said light detecting element is at least one of
    a one-dimensional light detector;
    a two-dimensional light detector; or
    a position-sensitive light detector.

11. The module according to claim 1, wherein
    said first substrate member has a first face which is substantially planar;
    said third substrate member has a fourth face facing said first face, which is substantially planar and is aligned substantially parallel to said first face; and
    said second substrate member has a second face facing said first face, which is substantially planar and is aligned substantially parallel to said first face and a third face facing said fourth face, which is substantially planar and is aligned substantially parallel to said first face.

12. The module according to claim 1, wherein by said first substrate member, at least one electrical connection across the first substrate member is provided.

13. The module according to claim 1, wherein said first, second and third substrate members and said first and second spacer members are of generally block- or plate-like shape, comprising at least one hole or comprising no hole.

14. The module according to claim 1, wherein outer bounds of a vertical silhouette of the module and outer bounds of a vertical silhouette of said first, second and third substrate members and of said first and second spacer members each describe a substantially rectangular shape.

15. The module according to claim 1, wherein at least one of said first substrate member, said second substrate member, said third substrate member, said first and second spacer members is, at least in part, made substantially of at least substantially non-transparent material.

16. The module according to claim 1, wherein at least one of said first and second spacer members is at least one of made of a hardened hardenable material and obtained using a replication process.

17. The module according to claim 1, wherein said second substrate member is, at least in part, at least one of made of a hardened hardenable material and obtained using a replication process.

18. The module according to claim 1, wherein at least one of said first or second spacer members is a unitary part.

19. An appliance comprising a multitude of sensor modules according to claim 1.

20. The appliance according to claim 19, comprising
a first substrate wafer comprising a multitude of said first substrate members;
a second substrate wafer comprising a multitude of said second substrate members;
a third substrate wafer comprising a multitude of said third substrate members;
a first spacer wafer comprising a multitude of said first spacer members, wherein said first spacer wafer is comprised in said first substrate wafer or is comprised in said second substrate wafer or is distinct from these;
a second spacer wafer comprising a multitude of said second spacer members, wherein said second spacer wafer is comprised in said third substrate wafer or is comprised in said second substrate wafer or is distinct from these;
a multitude of said light detecting elements arranged on said first substrate wafer;
a multitude of said light emission elements arranged on said first substrate wafer; and
a multitude of said sensing elements comprised in or arranged at said third substrate wafer.

21. A device comprising a sensor module according to claim 1, wherein the device comprises a printed circuit board to which said module is operationally connected.

22. The module according to claim 1 wherein said first transparent portion is located at said first opening, and said second transparent portion is located at said second opening.

23. The module according to claim 1 wherein said light emission element is located within or at said first opening and said light detecting element is located within or at said second opening.

24. A sensor module for sensing a magnitude, the sensor module comprising a sensing element which is sensitive to changes in said magnitude and an optical read-out arrangement for detecting changes of said sensing element, wherein said optical read-out arrangement comprises
a first substrate member;
a light detecting element and a light emission element, both arranged on and electrically connected to said first substrate member;
a second substrate member arranged between said first substrate member and said sensing element, comprising at least a first and a second transparent portion through which light can pass and at least one blocking portion, wherein each of said transparent portions is laterally surrounded by said at least one blocking portion in a plane perpendicular to a stacking direction of the substrate members, and wherein said transparent portions comprise at least a first optical structure; and
a first spacer member comprised in said first substrate member or comprised in said second substrate member or distinct from and located between these, which comprises at least a first and a second opening which are separated from each other by a portion of the first spacer member,
wherein the at least one blocking portion is non-transparent to light detectable by the light detecting element, and wherein the first spacer member is, at least in part, non-transparent to light detectable by the light detecting element to reduce optical cross-talk between the light emission element and the light detecting element.

25. The sensor module according to claim 24, wherein said light detecting element is at least one of
a one-dimensional light detector;
a two-dimensional light detector; or
a position-sensitive light detector.

26. A device comprising a sensor module according to claim 24, wherein the device comprises a printed circuit board to which said module is operationally connected.

* * * * *